(12) United States Patent
Grossmann

(10) Patent No.: US 10,935,897 B2
(45) Date of Patent: Mar. 2, 2021

(54) OPTICAL SYSTEM FOR MICROLITHOGRAPHY

(71) Applicant: Carl Zeiss SMT GmbH, Oberkochen (DE)

(72) Inventor: Jan Grossmann, Aalen (DE)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 16/777,998

(22) Filed: Jan. 31, 2020

(65) Prior Publication Data

US 2020/0166857 A1     May 28, 2020

Related U.S. Application Data

(63) Continuation of application No. PCT/EP2018/057865, filed on Mar. 28, 2018.

(30) Foreign Application Priority Data

Jul. 31, 2017   (DE) .................... 10 2017 213 121.7

(51) Int. Cl.
    *G03F 7/20*       (2006.01)
    *G02B 1/18*       (2015.01)

(52) U.S. Cl.
    CPC ........... *G03F 7/70925* (2013.01); *G02B 1/18* (2015.01); *G03F 7/7015* (2013.01); *G03F 7/70316* (2013.01)

(58) Field of Classification Search
    CPC .... G03F 7/70033; G03F 7/20; G03F 7/70775; G03F 7/70925; G03F 7/0002; G03F 7/2022; G03F 7/702; G03F 7/70466; G03F 1/54; G03F 7/70916; G03F 7/70933; G03F 7/70; G03F 7/70341; G03F 7/70883;
(Continued)

(56) References Cited

U.S. PATENT DOCUMENTS 6,290,180 B1    9/2001   Browall et al.
2001/0028443 A1*   10/2001   Yabu ................... G03F 7/70933
                                                         355/30
(Continued)

FOREIGN PATENT DOCUMENTS

DE     102005062430 A1     7/2007
DE     102006042987 A1     4/2008
(Continued)

OTHER PUBLICATIONS

PCT International Preliminary Report on Patentability and the Written Opinion, PCT/EP2018/057865, dated Feb. 4, 2020, 28 pages.
(Continued)

*Primary Examiner* — Mesfin T Asfaw
(74) *Attorney, Agent, or Firm* — Edell, Shapiro & Finnan, LLC

(57) ABSTRACT

A microlithographic optical system, wherein the optical system is designed for operation with electromagnetic radiation that passes through the optical system along a used beam path, and includes at least one component (105) having a region outside the used beam path, wherein this region has a catalytic or chemically active layer (110), and wherein the catalytic or chemically active layer (110) and/or a carrier (230, 240) bearing this layer (110) is porous.

20 Claims, 2 Drawing Sheets

(58) Field of Classification Search
CPC ...... G03F 7/2041; G03F 7/70983; G03F 1/64; H01L 21/0274; H01L 21/02057; H01L 21/67253; B01D 46/0086; B01D 46/10; G01N 21/3504; G01N 21/15; G01N 21/783; G02B 27/0006; B05B 15/60

See application file for complete search history.

(56) References Cited

U.S. PATENT DOCUMENTS

| | | |
|---|---|---|
| 2001/0043320 A1 | 11/2001 | Kato et al. |
| 2003/0082367 A1 | 5/2003 | Talpaert et al. |
| 2004/0137339 A1 | 7/2004 | Zhang et al. |
| 2007/0264494 A1 | 11/2007 | Krisko et al. |
| 2008/0143981 A1 | 6/2008 | Ehm et al. |
| 2009/0027638 A1* | 1/2009 | Van Empel ......... G03F 7/70908 355/30 |
| 2009/0226849 A1* | 9/2009 | Tsukamoto ............ G03B 27/52 430/325 |
| 2009/0231707 A1* | 9/2009 | Ehm ...................... G03B 27/16 359/509 |

FOREIGN PATENT DOCUMENTS

| | | |
|---|---|---|
| EP | 0887104 A1 | 8/1997 |
| EP | 1643310 A1 | 4/2006 |
| EP | 1783822 A1 | 5/2007 |

OTHER PUBLICATIONS

Kleffmann et al., "Does photocatalysis improve air quality?", Jun. 2016, 11 pages.
Entegris, Inc. GateKeeper Opticals Gas Purifiers, (2007-2010), 4 pages.
German Office Action with English translation, Application No. 10 2017 213 121.7, dated Feb. 9, 2017, 10 pages.
International Search Report, PCT/EP2018/057865, dated Jul. 12, 2018, 7 pages.

* cited by examiner

OPTICAL SYSTEM FOR MICROLITHOGRAPHY

CROSS REFERENCE TO RELATED APPLICATIONS

This is a Continuation of International Application PCT/EP2018/057865, which has an international filing date of Mar. 28, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 213 121.7 filed on Jul. 31, 2017.

FIELD OF THE INVENTION

The invention relates to a microlithographic optical system.

BACKGROUND

Microlithography is used for production of microstructured components, for example integrated circuits or LCDs. The microlithography process is carried out in a so-called projection exposure apparatus, which comprises an illumination device and a projection lens. The image of a mask (=reticle) illuminated by the illumination device is projected by the projection lens onto a substrate (e.g. a silicon wafer) coated with a light-sensitive layer (photoresist) and disposed in the image plane of the projection lens, in order to transfer the mask structure to the light-sensitive coating of the substrate.

In the operation of such a microlithographic projection exposure apparatus, in spite of the use of high-purity inert purge gases such as nitrogen ($N_2$), for example, the problem can occur that contaminants, especially in the form of hydrocarbons, enter the projection lens or else the illumination device. Such contaminants can in turn precipitate on the individual optical components (for example lens elements or mirrors) and then lead to unwanted absorption of the electromagnetic radiation that passes through the respective optical system in operation. This, in turn, results in a change in the respective optical properties (for example the refractive index of the lens elements or the reflectance of the mirrors). Further adverse effects are, for example, thermally induced deformations and, as the case may be, disruption of the uniformity of the electromagnetic radiation that reaches the mask or wafer.

Avoidance of the above-described contamination problem has proven to be difficult in practice, one reason being in particular that the hydrocarbons mentioned can enter into the respective optical system through sealants and adhesives used in the optical system and via unavoidable inlets for the purge gases used, such that use of inert purge gases of maximum purity alone does not provide a complete remedy in that respect.

Intensive cleaning of the respective optical elements conducted specially for avoidance of such contaminations requires interrupting the actual lithography process. This is not desirable, since operation that is as continuous as possible should be the aim, in order to maximize throughput of the projection exposure apparatus.

With regard to the prior art, reference is made merely by way of example to U.S. Pat. No. 6,290,180 B1, US 2007/0264494 A1, US 2003/0082367 A1 and EP 0 887 104 A1.

SUMMARY

It is an object of the present invention to provide a microlithographic optical system, which enables effective reduction of contamination without interrupting operation and without impairing the throughput through the optical system.

This object is achieved by the optical system according to the features of the independent claims.

The invention, according to one formulation, provides a microlithographic optical system which is designed for operation with electromagnetic radiation that passes through the optical system along a used beam path that has at least one component having a region outside the used beam path, wherein this region has a catalytic or chemically active layer, and wherein the catalytic or chemically active layer and/or a carrier bearing said layer is porous.

The invention is especially based on the concept of eliminating the contaminations described at the outset in the form of hydrocarbons during the operation of the respective optical system by enabling a self-cleaning process (still to be explained in detail hereinafter) in the system by providing a catalytic or chemically active layer in a region not utilized for optical purposes (for example for an imaging or exposure process). By virtue of the catalytic or chemically active layer and/or a carrier bearing said layer being porous, it is possible to provide a larger surface area and correspondingly to boost the process of accumulation and degradation of the contaminants or molecules.

The catalytic layer may especially be a photocatalytic layer.

The particular effect of the catalytic layer used in accordance with the invention is to convert comparatively non-volatile contaminants, for example hydrocarbons, to comparatively volatile molecules (for example having a lower molecular mass compared to hydrocarbons), or to promote this conversion by lowering the energy (for example thermal energy or radiation energy) required for cleavage of said contaminants with the catalytic layer. As a result, said cleavage may be brought about even automatically or by the action of the electromagnetic radiation present in the optical system in operation. The corresponding cleavage products may then, owing to their volatility, either be transported away directly (for example utilizing purge gases that are already present) or produced by being oxidized by traces of oxygen ($O_2$) and/or water ($H_2O$) that is present.

As a result, virtually complete breakdown or conversion of the contaminants to carbon dioxide ($CO_2$) and water ($H_2O$) can be achieved, with the consequence that it is possible to effectively avoid contamination-related impairment of the performance of the optical system. Since, owing to the above-described effect of the catalytic layer, said conversion of the contaminants is achieved even without requiring a further energy supply or needing to utilize the electromagnetic radiation already present in operation of the optical system, it is possible hereby to avoid significant interruptions of operation and associated impairment of throughput through the optical system.

In the configuration with a chemically active layer, this layer generates a cleaning effect via a chemical reaction and may include higher oxides of nickel, for example, that are reduced on contact with contamination and hence oxidize (up) the contamination in question.

The invention makes particular use of the fact that, even in the "normal" operation of an optical system, for example a microlithographic projection exposure apparatus, electromagnetic radiation in the form of stray light also enters into regions outside the actual used beam path, with the consequence that such regions can be utilized for the positioning of the catalytic layer of the invention.

In other words, any unwanted influence on the actual imaging or exposure process can be reliably avoided by the cleaning effect of the catalytic or chemically active layer in that said layer is positioned only in regions outside the actual used beam path. These regions may, for example (without restriction of the invention thereto), be subregions (for example insides) of frames or stops.

In addition, these regions utilized for application of the catalytic or chemically active layer of the invention may also be subregions of optical elements (especially lens elements or mirrors) that are outside the actual used beam path. In embodiments of the invention, over and above the above-described utilization of stray light, it is also possible here to bring about direct action of electromagnetic radiation on the catalytic layer in that an illumination setting suitable for the purpose is temporarily established (for example an extremely annular illumination setting with illumination only of an annular region on the radial outside of the optical system axis), in which the electromagnetic radiation is directed onto the catalytic layer of the invention but not, for example, onto a wafer present in the image plane of the projection lens.

By virtue of the (self-)cleaning process of the invention, according to the embodiment, being achieved "in situ" in operation of the optical system or at least without dismantling the optical system and hence enabling continuous degradation of contaminants, it is possible to avoid a time demand associated with additional cleaning steps and, as the case may be, also an unwanted interruption of the lithography process, such that a rise in the throughput of the projection exposure apparatus is ultimately achieved.

By contrast with conventional concepts for the use of functional layers, the use in accordance with the invention of the catalytic layer is not, for instance, for improvement of particular material properties (for example corrosion resistance), but includes the introduction of an additional functionality of the optical system, by which the electromagnetic radiation (e.g. scattered radiation) that passes through the optical system in operation is utilized for implementation of a self-cleaning process for the purpose of elimination of unwanted contaminants.

In one embodiment, the catalytic layer is integrated into an adhesive protection layer present on the component. This configuration has the advantage that the typically high radiation intensity in the corresponding regions of the adhesive protection layer can be utilized for the self-cleaning process of the invention and, in addition, the need to apply additional layers can be minimized.

In one embodiment, the catalytic or chemically active layer has been applied to a carrier transparent to the electromagnetic radiation.

In one embodiment, the catalytic layer has a thickness of at least 1 μm. In the case of configuration of the catalytic or chemically active layer with comparatively high thicknesses, a correspondingly large amount of contaminants or molecules can be accumulated or degraded in the optical system, with the possibility of simultaneous exploitation of a lack of disruptive light loss owing to the absorptive effect of the catalytic layer stemming from the positioning of the catalytic or chemically active layer in the optically unutilized region or outside the used beam path.

In one embodiment, the catalytic layer includes at least one material from the group comprising $TiO_2$, $ZnO$, $WO_3$, $CaTiO_3$, $SnO_2$, $CaTiO_3$, $MoO_3$, $NbO_5$, $Fe_2O_3$, $Ta_2O_5$ and $Ti_xZr_{1-x}O_2$ (with $0<x<1$). By selection of one or more of these materials, it is possible to achieve low particle emission or outgassing of the layer with a long lifetime.

In one embodiment, the optical system is operable in a multitude of illumination settings, wherein the electromagnetic radiation outside the used beam path in at least one of these illumination settings is deflected onto the catalytic layer.

In one embodiment, the catalytic or chemically active layer and/or the carrier that bears this layer divides the gas volume present within the optical system into two different regions. Owing to this division of the gas volume into two parts, the entire gas stream can be caused to pass through the component in question and hence achieve adhesion or chemical reaction of contaminations associated with a cleaning effect.

The invention also further relates to a microlithographic optical system, having a porous component that divides the gas volume present within the optical system into two different regions, wherein cleaning in the optical system is achieved by accumulating or chemically reacting the contaminants present in the optical system on this porous component.

In one embodiment, the optical system is designed for a working wavelength of less than 400 nm, particularly less than 250 nm, more particularly less than 200 nm.

In one embodiment, the optical system is a projection lens or an illumination device of a microlithographic projection exposure apparatus.

In one embodiment, the optical system is an inspection lens, especially an inspection lens of a wafer inspection system or a mask inspection system.

The invention also further relates to a microlithographic projection exposure apparatus having an illumination device and a projection lens, wherein the projection exposure apparatus has an arrangement having the features described above.

Further configurations of the invention can be inferred from the description and the dependent claims.

The invention is explained in greater detail below with reference to working examples shown in the appended figures.

DETAILED DESCRIPTION

First described hereinafter is a possible embodiment of the arrangement of the invention with reference to the schematic diagram in FIG. 1.

Figure 1:
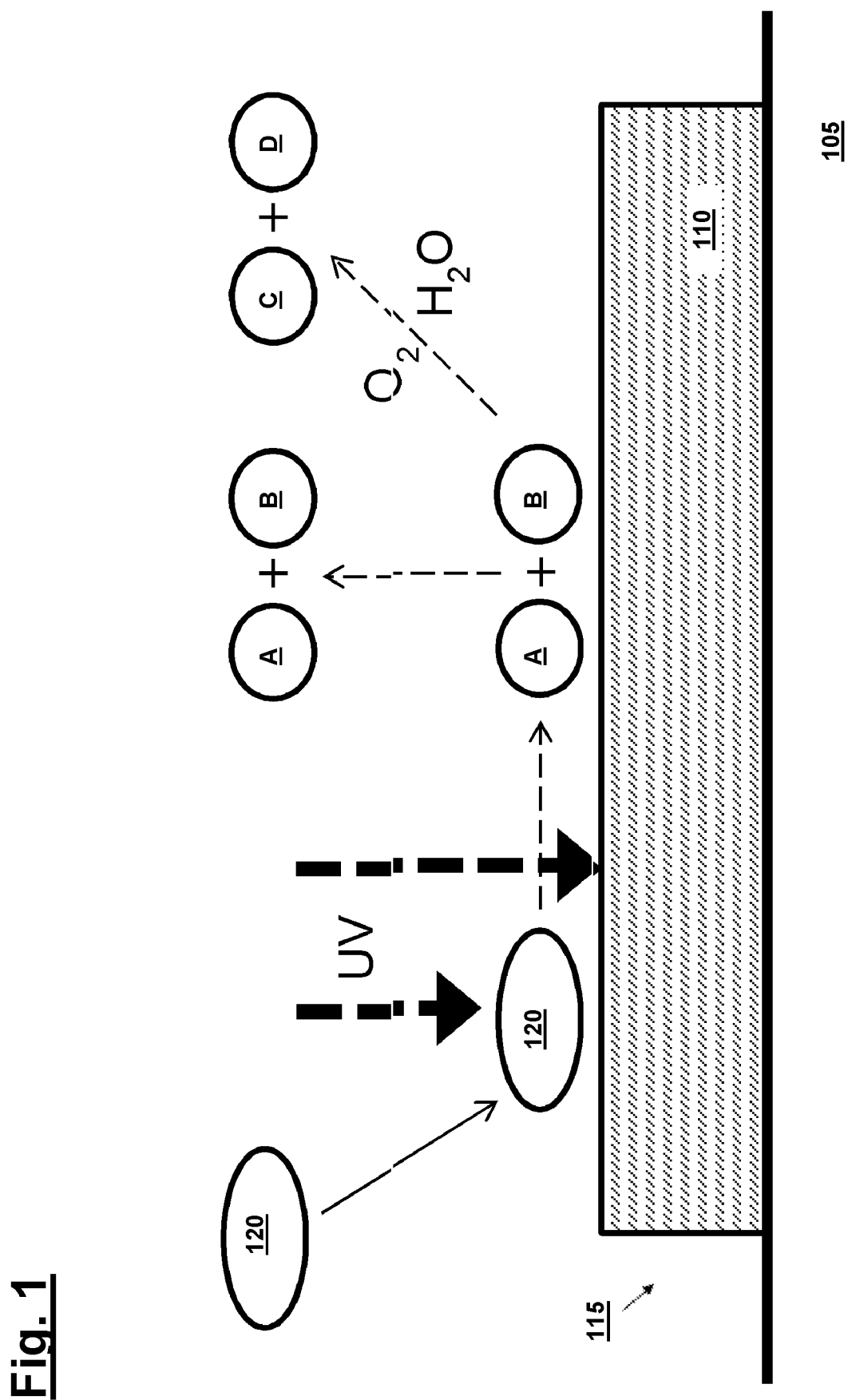
FIG. 1 a schematic diagram for illustrating the mode of operation of an arrangement of the invention for reduction of contamination in one embodiment.

In FIG. 1, "110" denotes a catalytic layer that has been applied in accordance with the invention in an optically unutilized region, or a region outside the used beam path, of a component 105 of a microlithographic optical system, for example a projection lens or an illumination device of a microlithographic projection exposure apparatus. Component 105 may, merely by way of example, be a stop or a frame. In addition, component 105 may also be a lens element or a mirror.

The catalytic layer 110 brings about lowering of the energy required (for example photon energy or temperature) for cleavage of unwanted nonvolatile contaminants, for example hydrocarbons, with the consequence that corresponding cleavage of the contaminants or hydrocarbons is effected and the fragments that arise here, as indicated in FIG. 1, can either be transported away directly utilizing purge gases present or oxidized by supply of oxygen ($O_2$) and/or water ($H_2O$).

Specifically, according to FIG. 1, a molecule 120 of an organic compound (e.g. hydrocarbon) which constitutes unwanted contamination in the optical system strikes the surface of the catalytic layer 110 and is at first bound on this surface. As likewise indicated in FIG. 1, in operation of the optical system, in spite of the fact that the catalytic layer 110 is disposed in the actually optically unutilized region or outside the used beam path, electromagnetic UV radiation strikes the molecule 120. This electromagnetic radiation may, for example, be scattered radiation or else radiation which is deflected onto the catalytic layer 110 in an illumination setting established specially for cleaning purposes (i.e. not for wafer exposure).

As indicated merely schematically in FIG. 1, the effect of the electromagnetic radiation, owing to the lowering of the energy required (for example photon energy or temperature) for cleavage of the molecule 120 brought about by the catalytic layer 110, is that the molecule 120 is cleaved into fragments (i.e. "activated") (for example the fragments "A" and "B" according to FIG. 1). These fragments, owing to their comparatively low molecular mass, can be purged more readily out of the optical system (e.g. projection lens), for example with the purge gases present, or, in further scenarios, as likewise indicated in FIG. 1, react with oxygen ($O_2$) or water ($H_2O$) and hence be oxidized (for example to components "C" and "D"). The effect of the latter reaction/oxidation is that the correspondingly degraded molecule 120 can be desorbed comparatively more easily and purged out of the optical system or projection lens.

Owing to the positioning of the catalytic layer 110 in the optically unutilized region or outside the used beam path, problems of unwanted light loss owing to the absorption effect of the catalytic layer 110 are avoided. As a result, the catalytic layer can be designed without regard to said absorption effect. In particular, the catalytic layer 110, according to the invention, may have a comparatively high thickness (for example in the order of magnitude of one or more micrometers), with the consequence that a correspondingly large amount of contaminants or molecules 120 can be accumulated and degraded, as described above.

In a further embodiment, the catalytic layer 110 may also have been applied to a carrier composed of transparent and porous material (e.g. $SiO_2$) in order to further enhance the accumulation and degradation process of the contaminants or molecules 120. In embodiments, it is also possible to guide the entire (purge) gas stream through said carrier. By configuring the carrier to be porous, it is possible to further enhance accumulation and conversion of the contaminants or molecules 120. In this context, it is possible to define the porosity via the relative density as a ratio of apparent density and true density, where this ratio should, for example, be greater than 40%.

By virtue of the configuration of the catalytic layer 110 with high porosity, the invention makes use of the fact that no mechanical forces at all have to be transmitted by the layer 110 in question, and the layer 110 can be designed solely with the aim of maximum effectiveness of conversion of contaminants (although it should be noted merely that the material of the catalytic layer itself does not show any outgassing effects at all or bring about contaminations in the optical system). High roughness of the catalytic layer 110 is likewise advantageous with regard to the desired binding of a maximum amount of contaminants or molecules.

In embodiments of the invention, integration of the catalytic layer 110 into an adhesive protection layer 115 is especially possible, which means that it is possible to utilize the radiation intensity which is typically high in the corresponding regions of the adhesive protection layer 115 and avoid the requirement for application of additional layers.

In further embodiments, the layer 110 may also be a chemically active layer, which layer achieves a cleaning effect via a chemical reaction. This layer may include, for example, higher oxides of nickel that are reduced on contact with contamination and hence oxidize (up) the contamination in question.

Figure 2:
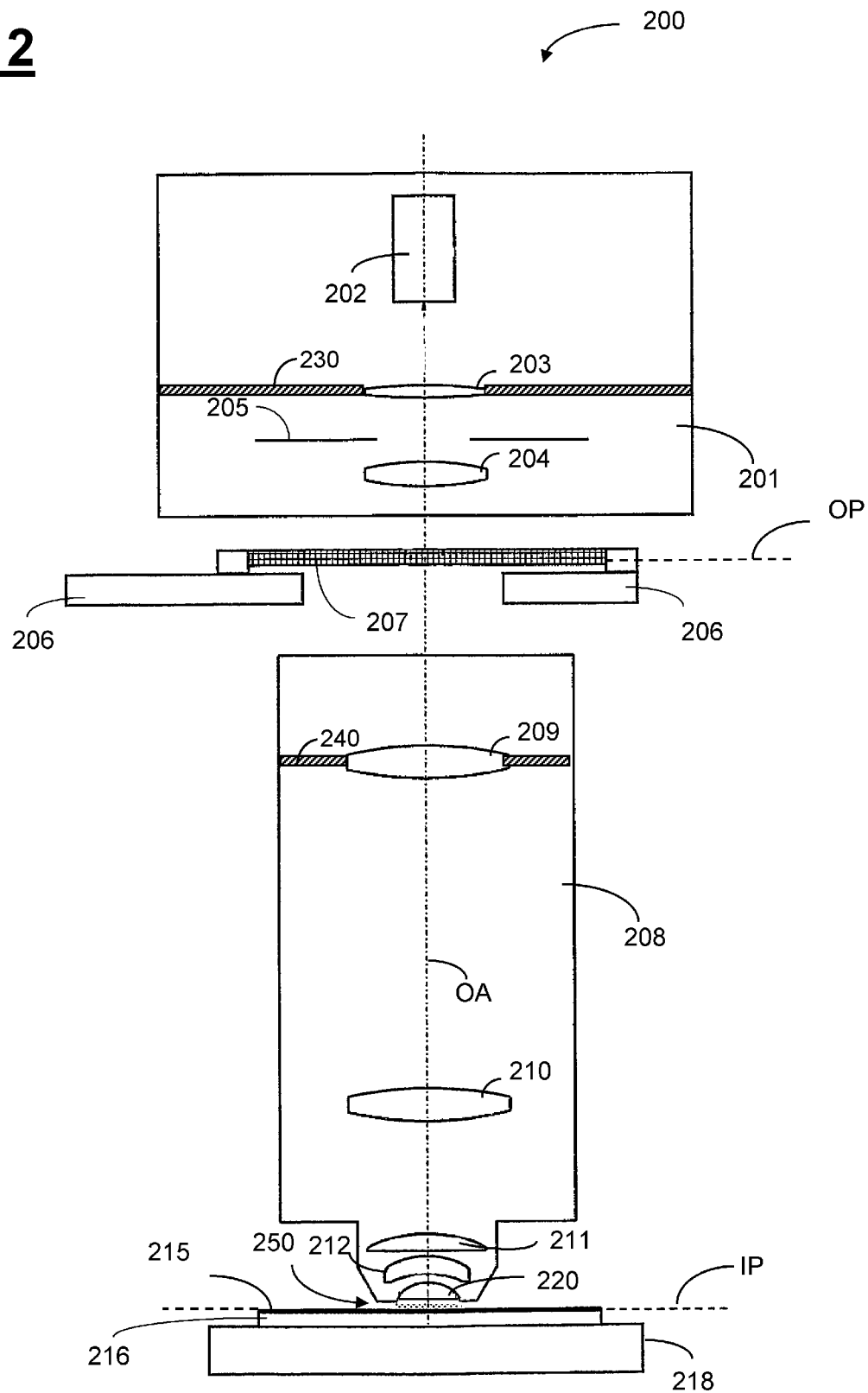
FIG. 2 a schematic diagram for illustration of a possible construction of a microlithographic projection exposure apparatus designed for operation in the DUV in which the invention can be implemented.

FIG. 2 shows a schematic diagram of a possible construction of a microlithographic projection exposure apparatus 200 which is designed for operation at wavelengths in the DUV range (e.g. about 193 nm) and includes an illumination device 201 and a projection lens 208.

The illumination device 201 comprises a light source 202 and illumination optics symbolized in highly simplified fashion by lens elements 203, 204 and a stop 205. The working wavelength of the projection exposure apparatus 200 in the example shown is 193 nm when using an ArF excimer laser as the light source 202. However, the working wavelength may, for example, also be 365 nm in the case of i-line systems, 248 nm when using a KrF excimer laser or 157 nm when using an $F_2$ laser as the light source 202. Between the illumination device 201 and the projection lens 208 is disposed a mask 207 that is held in the beam path using a mask holder 206 in the object plane OP of the projection lens 208. The mask 207 has a structure in the micrometer to nanometer range that is imaged, for example reduced by a factor 4 or 5, onto an image plane IP of the projection lens 208 by the projection lens 208. The projection lens 208 comprises a lens arrangement which is also symbolized merely in highly simplified fashion by lens elements 209 to 212 and 220 and defines an optical axis OA.

A substrate 216, or a wafer, that has been provided with a light-sensitive layer 215 and positioned with a substrate holder 218 is held in the image plane IP of the projection lens 208. Between the last optical element 220 on the image plane side of the projection lens 208 and the light-sensitive layer 215, in the working example (but without restriction of the invention thereto), there is an immersion medium 250 which may, for example, be deionized water.

FIG. 2 further indicates positions that are suitable by way of example for a porous carrier 230 or 240, to each of which a catalytic layer has been applied. These positions are each between a lens element (203 or 209) and the outer wall (the housing) of the illumination device 201 or the projection lens 208. These positions are advantageous in the presence of a high stray light content. Preferably, the porous carrier 230 or 240 or the catalytic layer here forms a section (or a separator or a separation layer), as a result of which the gas volume present within the optical system is divided into two different regions and the gas stream has to pass through them completely. In further embodiments, rather than the porous carrier, it is also possible to provide a porous component (without a catalytic or chemically active layer thereon) which likewise divides the gas volume present within the optical system into two different regions, in which case cleaning in the optical system is achievable via accumulation of contaminants present in the optical system on this porous component.

Although the invention has been described with reference to specific embodiments, numerous variations and alternative embodiments will be apparent to the person skilled in the art, for example through combination and/or exchange of features of individual embodiments. Accordingly, it will be apparent to a person skilled in the art that such variations and alternative embodiments are also encompassed by the present invention, and the realm of the invention is restricted only within the scope of the appended claims and the equivalents thereof.

What is claimed is:

1. A microlithographic optical system, configured for operation with electromagnetic radiation that passes through the optical system along a used beam path:
    comprising a housing and at least one component within the housing, wherein the component delimits a section within the housing that is outside the used beam path, the section comprising an adhesive protection layer, wherein the adhesive protection layer extends annularly within the section from the used beam path to a wall of the housing;
    wherein a catalytic or chemically active layer is integrated into the adhesive protection layer; and
    wherein the catalytic or chemically active layer and/or a carrier bearing said layer is porous.

2. The optical system as claimed in claim 1, wherein the catalytic layer reduces an energy required for cleavage and/or oxidation of contaminants present in the optical system in comparison with an analogous system without the catalytic layer.

3. The optical system as claimed in claim 2, wherein these contaminants include hydrocarbons.

4. The optical system as claimed in claim 1, wherein the component is a stop or a frame.

5. The optical system as claimed in claim 1, wherein the component is a lens element or a mirror.

6. The optical system as claimed in claim 1, wherein the catalytic or chemically active layer is applied to the carrier, which is transparent to the electromagnetic radiation.

7. The optical system as claimed in claim 1, wherein the catalytic layer has a thickness of at least 1 μm.

8. The optical system as claimed in claim 1, wherein the catalytic layer includes at least one material from the group comprising $TiO_2$, $ZnO$, $WO_3$, $CaTiO_3$, $SnO_2$, $CaTiO_3$, $MoO_3$, $NbO_5$, $Fe_2O_3$, $Ta_2O_5$ and $Ti_xZr_{1-x}O_2$, where $0<x<1$.

9. The optical system as claimed in claim 1, configured to be operable in a plurality of illumination settings, wherein the electromagnetic radiation outside the used beam path in at least one of these illumination settings is deflected onto the catalytic layer.

10. The optical system as claimed in claim 1, wherein the catalytic or chemically active layer and/or the carrier bearing said layer divides the gas volume present within the optical system into two different regions.

11. The optical system as claimed in claim 1, configured for an operating wavelength of less than 400 nm.

12. The optical system as claimed in claim 1, configured as a projection lens or an illumination device for a microlithographic projection exposure apparatus.

13. The optical system as claimed in claim 1, wherein the component is an inspection lens.

14. The optical system as claimed in claim 1, configured as a wafer inspection system or as a mask inspection system.

15. A microlithographic projection exposure apparatus comprising an illumination device and a projection lens, wherein the projection exposure apparatus comprises an optical system as claimed in claim 1, wherein the optical system is arranged in the illumination device or in the projection lens and wherein the projection exposure apparatus further comprises a mask disposed in the used beam path between the optical system and the projection lens.

16. The optical system as claimed in claim 1, wherein the adhesive protection layer is a barrier such that an entire gas stream is guided through the adhesive protection layer.

17. The optical system as claimed in claim 1, wherein the at least one component comprises a stop frame and a mirror, each of which comprises the adhesive protection layer with the catalytic or chemically active layer integrated therein.

18. A microlithographic optical system defining a gas volume within the optical system, comprising:
    a housing; and
    a porous component that divides the gas volume into two different regions, wherein the porous component is configured and arranged to clean the gas volume in the optical system by accumulating contaminants present within the optical system on the porous component, and wherein the porous component extends annularly from an optical element disposed in the housing to a wall of the housing, forming a separation layer.

19. The microlithographic optical system as claimed in claim 18, wherein the porous component divides the gas volume into the two different regions such that an entire gas stream is guided through the porous component.

20. The microlithographic optical system as claimed in claim 18, wherein a ratio of apparent density and true density of the porous component is greater than 40%.

* * * * *

UNITED STATES PATENT AND TRADEMARK OFFICE
CERTIFICATE OF CORRECTION

PATENT NO. : 10,935,897 B2
APPLICATION NO. : 16/777998
DATED : March 2, 2021
INVENTOR(S) : Jan Grossmann Page 1 of 1

It is certified that error appears in the above-identified patent and that said Letters Patent is hereby corrected as shown below:

In the Specification

In Column 3, Line 67, after "$SnO_2$," delete "$CaTiO_3$,".

In the Claims

In Column 7, Line 48, in Claim 8, after "$SnO_2$," delete "$CaTiO_3$,".

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*